United States Patent
Yeo et al.

(10) Patent No.: US 7,670,912 B2
(45) Date of Patent: Mar. 2, 2010

(54) METHODS OF FABRICATING MULTICHANNEL METAL OXIDE SEMICONDUCTOR (MOS) TRANSISTORS

(75) Inventors: Kyoung-Hwan Yeo, Seoul (KR); Dong-Gun Park, Gyeonggi-do (KR); Jeong-Dong Choe, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 716 days.

(21) Appl. No.: 10/797,463

(22) Filed: Mar. 10, 2004

(65) Prior Publication Data

US 2004/0227181 A1 Nov. 18, 2004

(30) Foreign Application Priority Data

May 15, 2003 (KR) ................. 10-2003-0030883

(51) Int. Cl.
*H01L 21/336* (2006.01)

(52) U.S. Cl. .................. 438/283; 257/E21.421
(58) Field of Classification Search ................. 438/157, 438/197, 283; 257/E21.421
See application file for complete search history.

(56) References Cited

U.S. PATENT DOCUMENTS

| | | | | |
|---|---|---|---|---|
| 5,153,688 A | * | 10/1992 | Oda et al. | 257/24 |
| 5,500,545 A | * | 3/1996 | Cheng et al. | 257/341 |
| 5,583,362 A | * | 12/1996 | Maegawa | 257/347 |
| 5,965,914 A | * | 10/1999 | Miyamoto | 257/331 |
| 6,013,936 A | | 1/2000 | Colt, Jr. | |
| 6,166,412 A | * | 12/2000 | Kim et al. | 257/366 |
| 6,236,068 B1 | * | 5/2001 | Feiler | 257/133 |
| 7,002,207 B2 | * | 2/2006 | Kim et al. | 257/331 |
| 7,361,545 B2 | * | 4/2008 | Li et al. | 438/241 |
| 2002/0115240 A1 | * | 8/2002 | Assaderaghi et al. | 438/149 |
| 2004/0227181 A1 | * | 11/2004 | Yeo et al. | 257/328 |
| 2004/0262690 A1 | * | 12/2004 | Coronel et al. | 257/365 |
| 2005/0023619 A1 | * | 2/2005 | Orlowski et al. | 257/401 |
| 2005/0112851 A1 | * | 5/2005 | Lee et al. | 438/497 |
| 2006/0240622 A1 | * | 10/2006 | Lee et al. | 438/257 |

FOREIGN PATENT DOCUMENTS

| | | |
|---|---|---|
| JP | 08-181328 | 7/1996 |
| KR | 1020020078996 A | 10/2002 |

* cited by examiner

*Primary Examiner*—Jarrett J Stark
(74) *Attorney, Agent, or Firm*—Myers Bigel Sibley & Sajovec

(57) ABSTRACT

Unit cells of metal oxide semiconductor (MOS) transistors are provided including an integrated circuit substrate an a MOS transistor on the integrated circuit substrate. The MOS transistor includes a source region, a drain region and a gate. The gate is positioned between the source region and the drain region. A horizontal channel is provided between the source and drain regions. The horizontal channel includes at least two spaced apart horizontal channel regions. Related methods of fabricating MOS transistors are also provided.

18 Claims, 14 Drawing Sheets

METHODS OF FABRICATING MULTICHANNEL METAL OXIDE SEMICONDUCTOR (MOS) TRANSISTORS

RELATED APPLICATION

This application is related to and claims priority from Korean Patent Application No. 2003-30883, filed on May 15, 2003, the disclosure of which is hereby incorporated herein by reference as if set forth in its entirety.

FIELD OF THE INVENTION

The present invention relates to integrated circuit devices and methods of fabricating the same and, more specifically, to metal oxide semiconductor (MOS) transistors and methods of fabricating the same.

BACKGROUND OF THE INVENTION

As integrated circuit devices become more highly integrated, the overall size of metal oxide semiconductor (MOS) transistors have become smaller and channel lengths of the MOS transistors have also been reduced. Accordingly, short channel MOS transistors may experience a punch-through phenomenon that may cause large leakage currents between source and drain regions of the transistor. In addition, source and drain junction capacitances and gate capacitances may also increase. Thus, it may be difficult to provide high performance, low power integrated circuit devices.

To address the problems with MOS transistors discussed above, silicon on insulator (SOI) technology using a SOI substrate has been introduced. A SOI substrate typically includes a supporting substrate, an insulating layer on the supporting substrate and a silicon layer on the insulating layer. SOI devices may provide low junction leakage currents, reduction in frequency of punch-through, low operation voltage and high efficiency in device isolation. However, heat generated from SOI devices during operation may not be efficiently conducted to the supporting substrate due to the insulating layer between the supporting substrate and the silicon layer. Accordingly, temperatures of SOI devices may increase and thereby degrade the overall characteristics of the device. Furthermore, SOI devices may experience a floating body effect that may cause a parasitic bipolar transistor action and complex manufacturing techniques may be used to remove the floating body effect. Accordingly, improved integrated circuit devices and methods of fabricating integrated circuit devices may be desired.

SUMMARY OF THE INVENTION

Embodiments of the present invention provide a unit cell of a metal oxide semiconductor (MOS) transistor, the unit cell including an integrated circuit substrate a MOS transistor on the integrated circuit substrate. The MOS transistor includes a source region, a drain region and a gate. The gate is positioned between the source region and the drain region. A horizontal channel is provided between the source and drain regions. The horizontal channel includes at least two spaced apart horizontal channel regions.

In some embodiments of the present invention, the at least two spaced apart horizontal channel regions include an active region on the integrated circuit substrate and at least one epitaxial pattern on the active region and spaced apart from the active region. In certain embodiments of the present invention, the at least one epitaxial pattern includes first and second epitaxial patterns. The second epitaxial pattern may be positioned on the first epitaxial pattern and spaced apart from the first epitaxial pattern. The unit cell may further include a mask pattern on the second epitaxial pattern. The second epitaxial pattern may be directly connected to the mask pattern.

In further embodiments of the present invention, the source and drain regions include vertical source and drain regions. The vertical source region may be positioned on a first side of the horizontal channel region and the vertical drain region may be positioned on a second side of the horizontal channel region. The vertical drain region may also be spaced apart from the source region.

In still further embodiments of the present invention, a gate pattern is provided on the horizontal channel and between the at least two spaced apart horizontal channel regions. A gate insulation layer may also be provided between the gate pattern and the at least two spaced apart horizontal channel regions channel. Source and drain electrodes may be electrically coupled to the vertical source and drain regions, respectively. A first insulation pattern may be provided between the source and drain electrodes and the integrated circuit substrate and between the gate pattern and the integrated circuit substrate.

In some embodiments of the present invention, a mask pattern may be provided on the horizontal channel. The gate pattern may extend between an upper channel region of the at least two spaced apart horizontal channel regions and the mask pattern. A second insulation pattern may also be provided on the horizontal channel and the vertical source and drain regions. The second insulation pattern may define a gate opening on the horizontal channel. The gate pattern may be provided in the gate opening and the source and drain electrodes may extend through the second insulation pattern and be connected to the vertical source drain regions.

In further embodiments of the present invention, a third insulation pattern may be provided on the second insulation pattern and the gate pattern. The source and drain electrodes may extend through the third insulation pattern and the second insulation pattern to be connected to the vertical source and drain regions. An upper surface of the first insulation pattern may be higher relative to a lower surface of the gate pattern.

While the present invention is described above primarily with reference transistors, methods of forming transistors are also provided herein.

BRIEF DESCRIPTION OF THE DRAWINGS

FIGS. 2A through 9A are cross-sections illustrating processing steps in the fabrication of transistors according to some embodiments of the present invention.

FIGS. 2B through 9B are cross-sections taken along the lines A-A' of FIGS. 2A through 9A illustrating processing steps in the fabrication of transistors according to some embodiments of the present invention.

FIGS. 2C through 9C are cross-sections taken along the line B-B' of FIGS. 2A through 9A illustrating processing steps in the fabrication of transistors according to some embodiments of the present invention.

DETAILED DESCRIPTION OF EMBODIMENTS OF THE PRESENT INVENTION

Figure 1A:
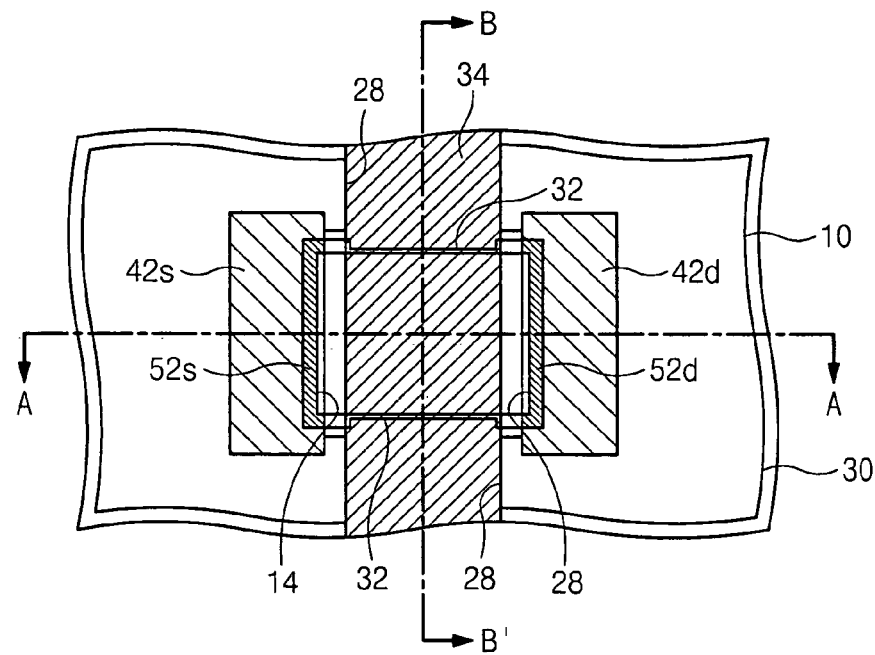
FIG. 1A is a cross-section of transistors according to some embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be further understood that when a layer is referred to as being "on" to another layer, it can be directly on the other layer or intervening layers may also be present. It will be further understood that when a layer is referred to as being "directly on" another layer, no intervening layers may be present. Like numbers refer to like elements throughout.

It will be understood that although the terms first and second are used herein to describe various layers or regions, these layers or regions should not be limited by these terms. These terms are only used to distinguish one layer or region from another layer or region. Thus, a first layer or region discussed below could be termed a second layer or region, and similarly, a second layer or region may be termed a first layer or region without departing from the teachings of the present invention.

Embodiments of the present invention will be described below with respect to FIGS. 1A through 10C. Embodiments of the present invention provide unit cells of metal oxide semiconductor (MOS) transistors that include a horizontal channel having at least two spaced apart channel regions. Thus, when a gate voltage is applied to a gate electrode, at least two channels are formed at the at least two spaced apart horizontal channel regions. MOS transistors according to some embodiments of the present invention may provide increased driving currents regardless of the dimensions of the transistor due to the multiple channels corresponding to the at least two spaced apart horizontal channel regions. Accordingly, improved MOS transistors may be provided according to embodiments of the present invention as discussed further below.

Figure 1B:
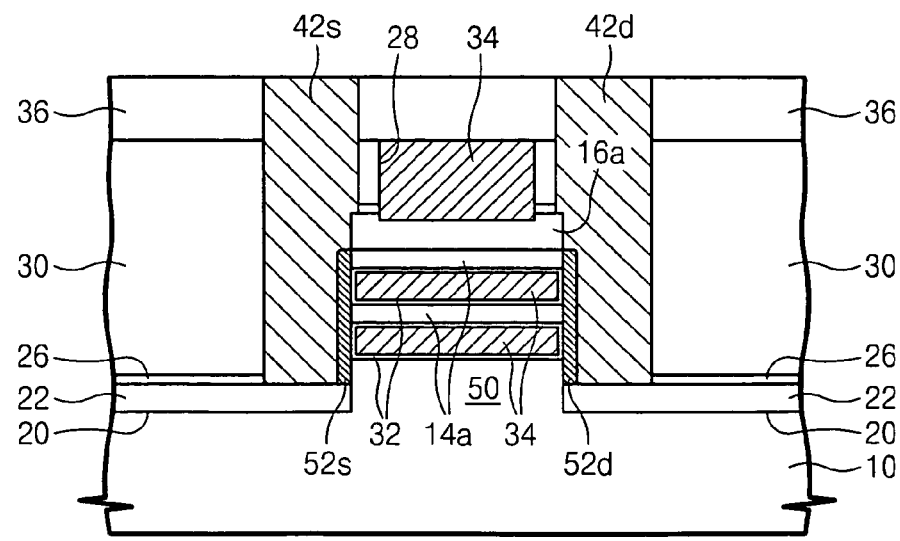
FIG. 1B is a cross-section taken along the line A-A' of FIG. 1A.
Figure 1C:
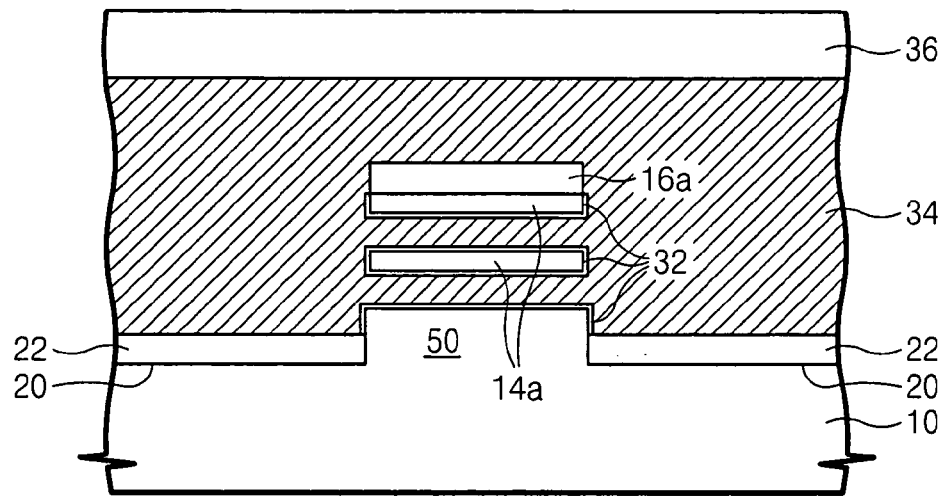
FIG. 1C is a cross-section taken along the line B-B' of FIG. 1A.

Referring now to FIGS. 1A through 1C, cross-sections of transistors according to embodiments of the present invention will be discussed. FIG. 1A is a cross-section of transistors according to some embodiments of the present invention. FIG. 1B is a cross-section taken along the line A-A' of FIG. 1A. Similarly, FIG. 1C is a cross-section taken along the line B-B' of FIG. 1A. As illustrated in FIGS. 1A, 1B and 1C, a MOS transistor is provided on an integrated circuit substrate 10. The transistor includes a source region 52s, a drain region 52d and a gate 34 (gate pattern). The gate 34 is provided between the source region 52s and the drain region 52d. A horizontal channel is provided between the source and drain regions 52s and 52d and includes at least two spaced apart horizontal channel regions 14a and 50. The source and drain regions 52s and 52d are vertical source and drain regions 52s and 52d. The vertical source region 52s is provided on a first side of the horizontal channel regions 14a and 50 and the vertical drain region 52d is provided on a second side of the horizontal channel regions 14a and 50 and is spaced apart from the vertical source region 52s. In embodiments of the present invention illustrated in FIGS. 1A through 1C, the at least two spaced apart horizontal channel regions include an active region 50 and first and second epitaxial patterns 14a. The active region 50 may be defined by a trench 20. First and second epitaxial patterns 14a may be stacked sequentially on the integrated circuit substrate and the active region 50.

It will be understood that embodiments of the present invention illustrated in FIGS. 1A through 1C are provided for exemplary purposes only and that embodiments of the present invention are not limited to this configuration. For example, the horizontal channel illustrated in FIGS. 1A through 1C includes an active region 50 and first and second epitaxial patterns 14a, i.e., three spaced apart horizontal channel regions 50 and 14a. However, horizontal channels according to some embodiments of the present invention may include two spaced apart horizontal channel regions or more than three horizontal channel regions without departing from the scope of the present invention.

A gate pattern 34 may be provided in a gap region of the horizontal channel regions 14a and 50. The gate pattern may be provided on the horizontal channel regions 14a and 50. A gate insulation layer 32 may be provided between the horizontal channel regions 14a and 50 and the gate pattern 34. A mask pattern 16a is provided on an upper surface of the second epitaxial pattern 14a. In other words, the mask pattern 16a is provided on an upper surface of the last horizontal channel region 14a in the stack of spaced apart channel regions 50 and 14a. The mask pattern 16a is provided between the upper surface of the second epitaxial pattern 14a and the gate pattern 34. The vertical source and drain regions 52s and 52d are electrically coupled to a source electrode 42s and a drain electrode 42d, respectively.

In some embodiments of the present invention, a first insulation pattern 22 may be provided between the source and drain electrodes 42s and 42d and the integrated circuit substrate 10 to reduce leakage of a current from the source and drain electrodes 42s and 42d into the integrated circuit substrate 10. A second insulation pattern 30 may be provided on a surface of the integrated circuit substrate 10, including the horizontal channel regions 14a and 50 and the vertical source and drain regions 52s and 52d. The second insulation pattern 30 may define a gate opening. The gate pattern 34 may be provided in the gate opening using, for example, a damascene process. Furthermore, source and drain electrodes 42s and 42d may penetrate the second insulation pattern 30, electrically coupling the source and drain electrodes 42s and 42d to the source and drain regions 52s and 52d.

A third insulation pattern 36 may be provided on the second insulation pattern 30. In embodiments of the present invention including the third insulation pattern 36, the third insulation pattern 36 may electrically insulate an interconnection connected to source and drain electrodes 42s and 42d and the gate pattern 34. Furthermore, an etch stop layer 26 may be provided between a lower surface of the second insulation pattern 30 and the first insulation pattern 22. The etch stop layer 26 may reduce the likelihood that the first insulation pattern 22 will be over etched during a process of forming the source and drain electrodes 42s and 42d. The etch stop layer 26 may also reduce the likelihood that the first insulation pattern 22 will be over etched during a process of forming the gate opening 28.

Figure 1D:
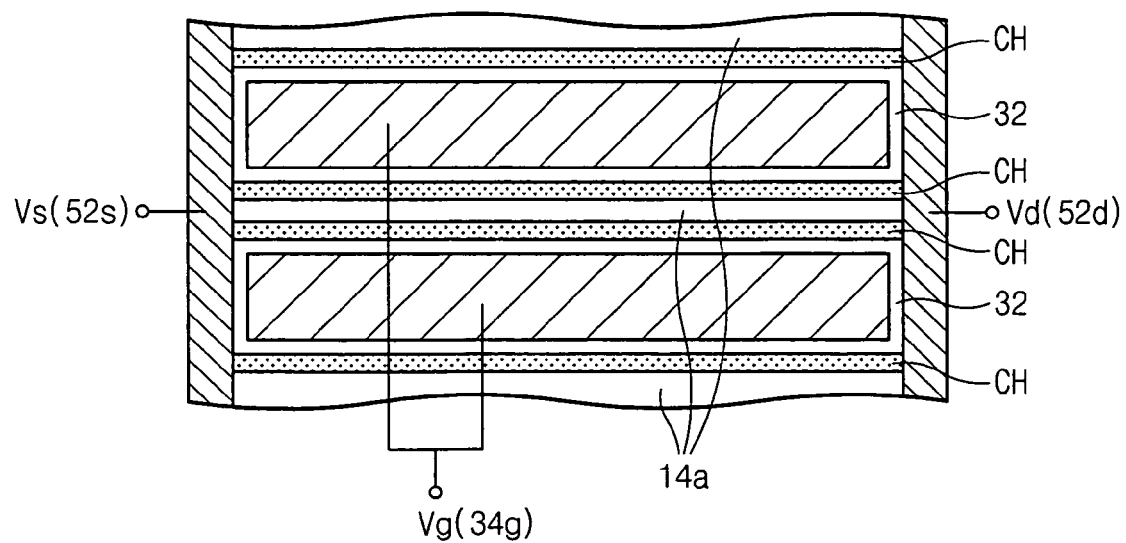
FIG. 1D is cross-section illustrating operations of transistors according to some embodiments of the present invention.

Referring now to FIG. 1D, a cross-section illustrating operations of transistors according to embodiments of the present invention will be discussed. As illustrated in FIG. 1D, a source voltage Vs and a drain voltage Vd are applied to a source 52s and a drain 52d, respectively. When a gate voltage Vg is applied to a gate electrode 34g, a channel (CH) is formed at the horizontal channel regions 14a and 50. In particular, a channel is formed at the active region 50 and the first and second epitaxial patterns 14a. Accordingly, transistors according to some embodiments of the present invention, may provide increased driving currents regardless of the dimensions of the transistor due to the multiple channels that are formed at the at least two spaced apart horizontal channel regions.

Referring now to FIGS. 2A through 9C, cross-sections illustrating processing steps in the fabrication of transistors according to embodiments of the present invention will be discussed. FIGS. 2A through 9A are cross-sectional views illustrating processing steps in the fabrication of transistors according to some embodiments of the present invention. FIGS. 2B through 9B are cross-sections taken along the line A-A' of FIGS. 2A through 9A. FIGS. 2C through 9C are cross-sections taken along the line B-B' of FIGS. 2A through 9A.

Figure 2A:
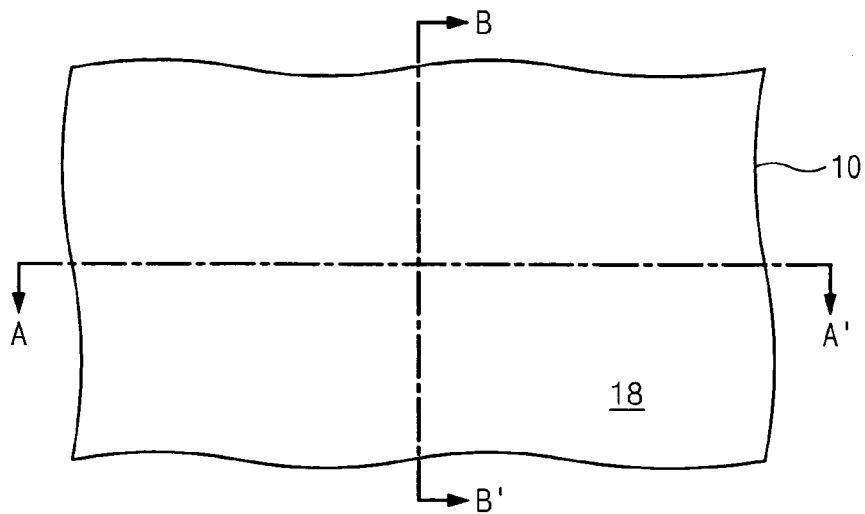
Figure 2B:
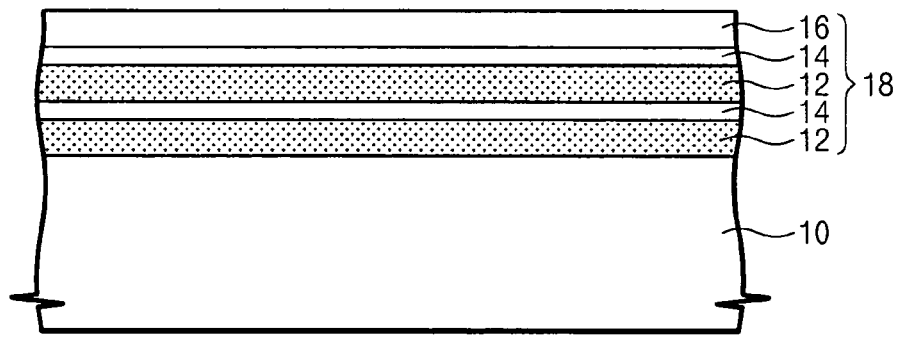
Figure 2C:
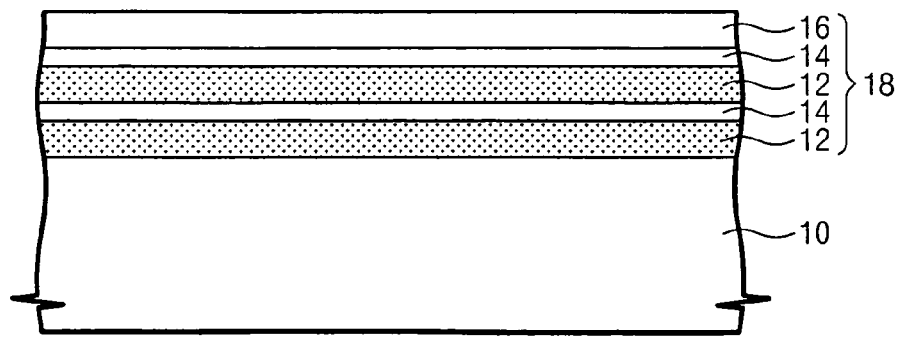

Referring now to FIGS. 2A through 2C, a stacked layer 18 is formed on the integrated circuit substrate 10. In particular, a first epitaxial layer 12 is formed on the integrated circuit substrate. A second epitaxial layer 14 is formed on the first epitaxial layer 12. As illustrated in FIGS. 2B and 2C, a second set of first and second epitaxial layers 12 and 14 may be provided on the first set of first and second epitaxial layers 12 and 14. It will be understood that although embodiments of the present invention are discussed herein as including two sets of first and second epitaxial layers 12 and 14 on the integrated circuit substrate, embodiments of the present invention are not limited to this configuration. For example, three or more sets of first and second epitaxial layers may be provided on the integrated circuit substrate 10 without departing from the scope of the present invention. The first epitaxial layer 12 may include a material, for example, silicon germanium, having high etch selectivity relative the integrated circuit substrate 10, which includes, for example, silicon. The second epitaxial layer 14 may include a material similar to the material making up the integrated circuit substrate 10, for example, silicon. Finally, the stacked layer 18 may include a mask layer 16 formed on the second epitaxial layer 14 of the upper most set of first and second epitaxial layers 12 and 14. The second epitaxial layer or layers 14 may be doped by implanting impurities into the stacking the second epitaxial layer or layers 14 after forming the stacking structure 18 or during the formation of the sets of first and second epitaxial layers 12 and 14.

Figure 3A:
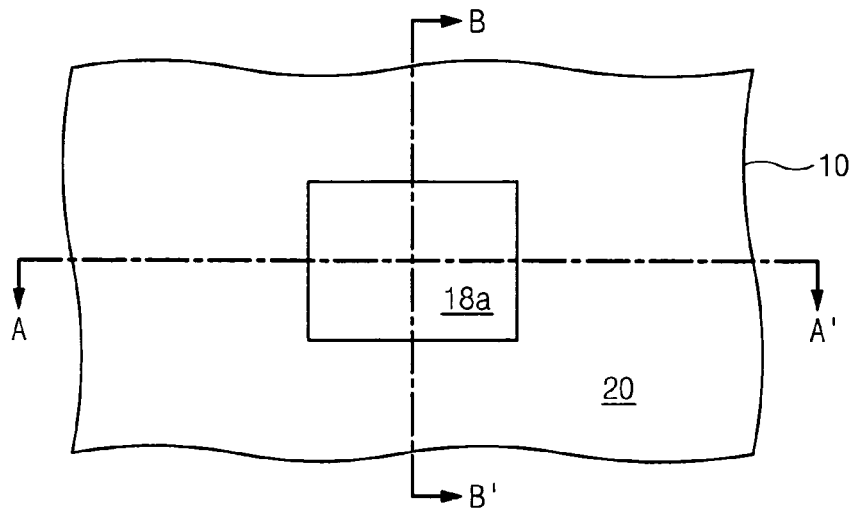
Figure 3B:
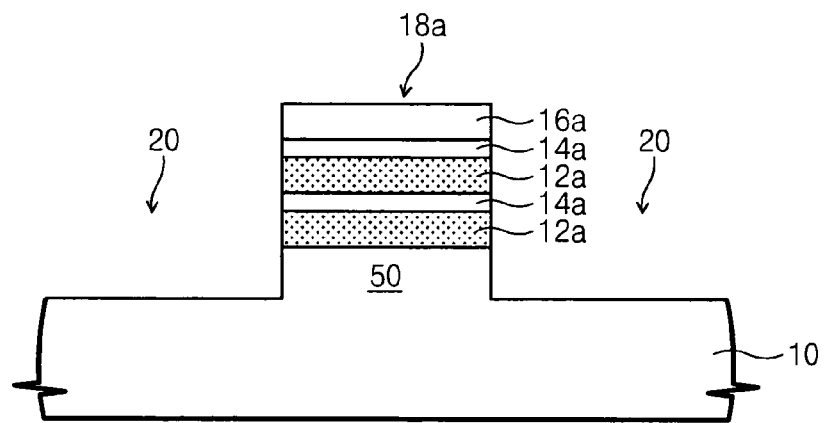
Figure 3C:
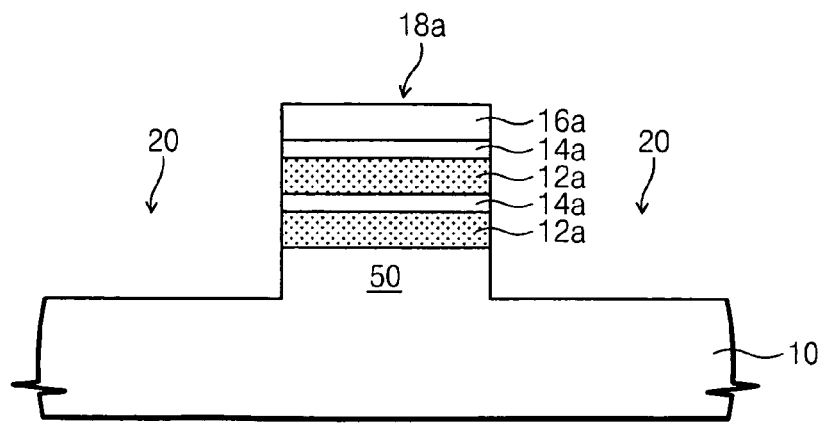

Referring now to FIGS. 3A through 3C, the stacked layer 18 and the integrated circuit substrate 10 are patterned to form a trench 20 and a stacked pattern 18a. The trench 20 defines an active region 50 of the integrated circuit substrate 10. The stacked pattern 18a is formed on the active region 50. The stacked pattern 18a includes first and second sets of first and second epitaxial patterns 12a and 14a, which are alternately stacked on the active region 50. As illustrated in FIGS. 3B and 3C, the stacked pattern 18a may further include a mask pattern 16a.

Figure 4A:
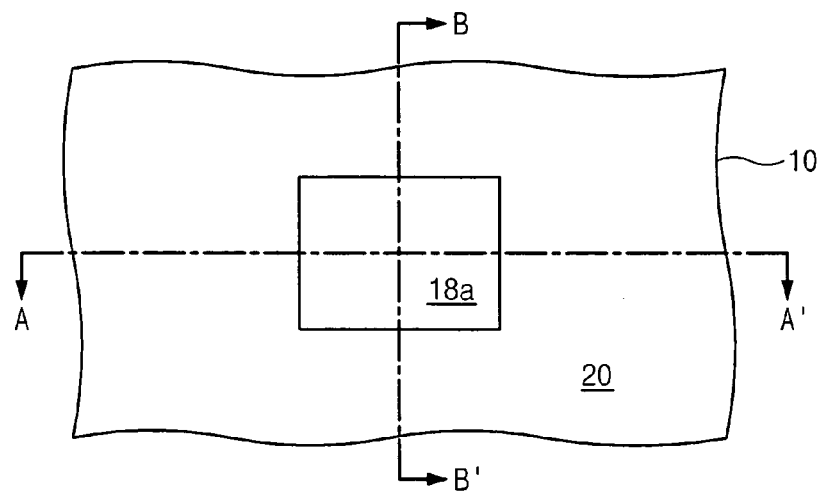
Figure 4B:
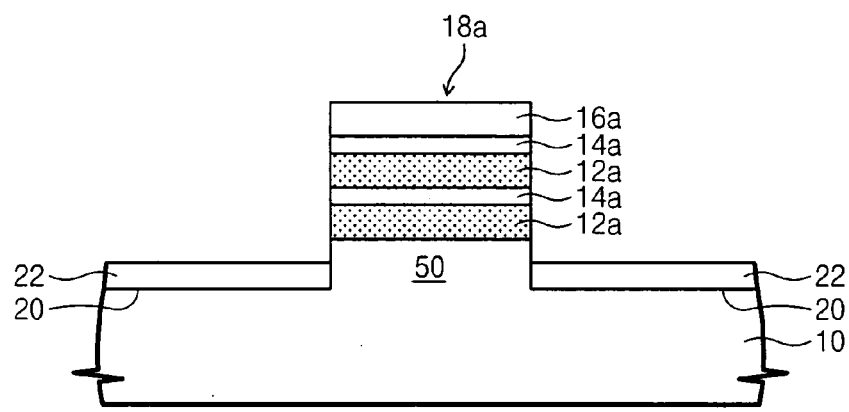
Figure 4C:
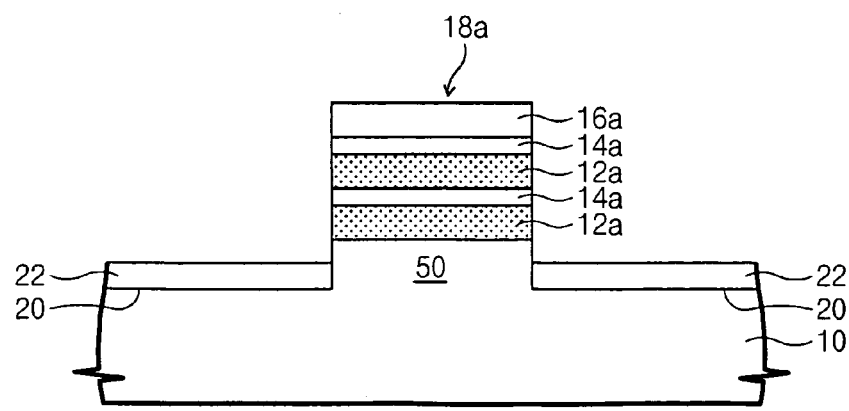

Referring now to FIGS. 4A through 4C, a first insulation pattern 22 is formed on a floor of the trench 20. The first insulation pattern 22 may be formed by providing an insulation layer on a surface of the integrated circuit substrate 10 and recessing the insulation layer. Accordingly, the first insulation pattern 22 is provided on the integrated circuit substrate around the stacked pattern 18a. The first insulation pattern 22 may be formed by recessing the first insulation layer 22 until the first epitaxial pattern 12a is exposed. As illustrated in FIGS. 4B and 4C, a bottom surface of the active region may be low relative to an upper surface of the first insulation pattern 22. However, in some embodiments of the present invention, a bottom surface of the active region can be high relative to the upper surface of the first insulation pattern 22 without departing from the scope of the present invention.

Figure 5A:
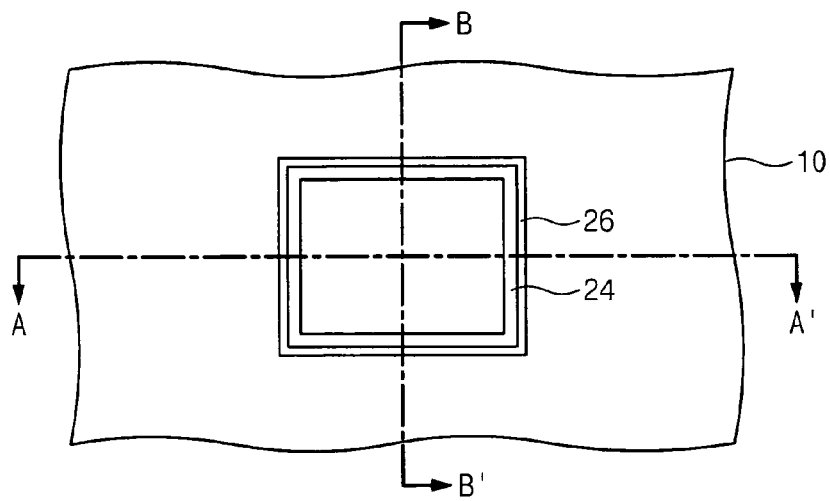
Figure 5B:
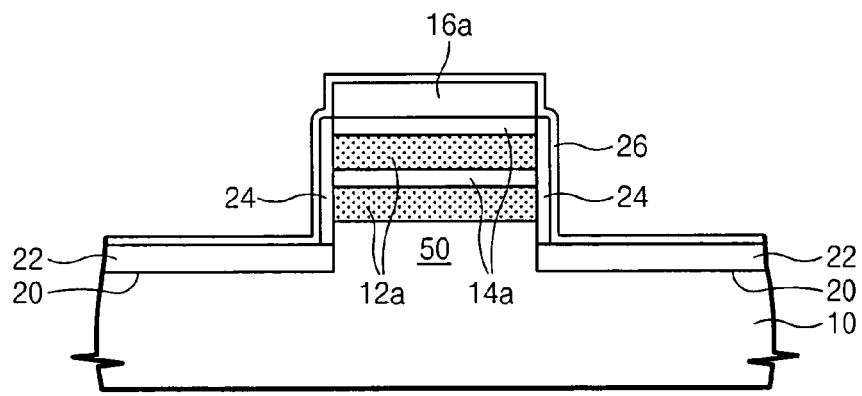
Figure 5C:
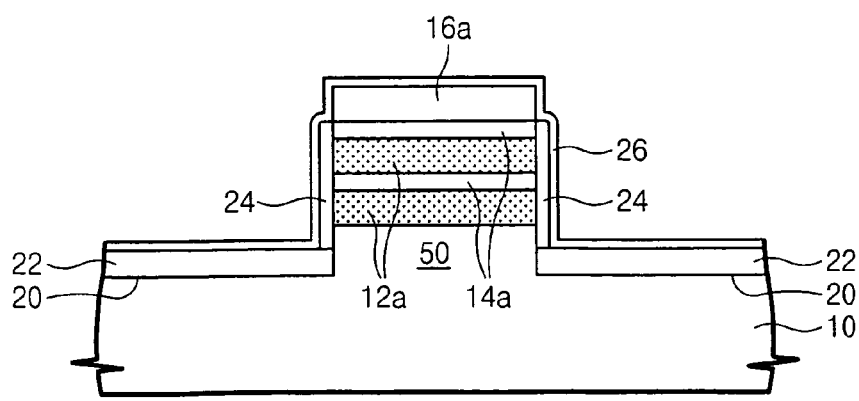

Referring now to FIGS. 5A through 5C, a third epitaxial layer 24 may be formed on the surface of the stacked pattern 18a and the exposed surface of the integrated circuit substrate 10 using, for example, a selective epitaxial growth (SEG) process. In embodiments of the present invention including a mask pattern 16a as part of the stacked pattern, the third epitaxial layer 24 may be formed on the sidewalls of the stacked pattern 18a where the second epitaxial patterns 14a are exposed. The third epitaxial layer 24 may include a material having an etch selectivity with respect to the first epitaxial pattern 12a and a similar material as the second epitaxial pattern 14a. For example, the third epitaxial layer 24 may include silicon.

Source and drain regions may be formed by implanting impurities into the third epitaxial layer 24. It will be understood that the source and drain regions may be formed in a subsequent process using, for example, conformal concentration using an oblique ion implantation. An etch stop layer 26 is formed on a surface of the integrated circuit substrate 10. The presence of the etch stop layer 26 may reduce the likelihood of over etching the first insulation pattern 22. The etch stop layer 26 may include, for example, silicon nitride.

Figure 6A:
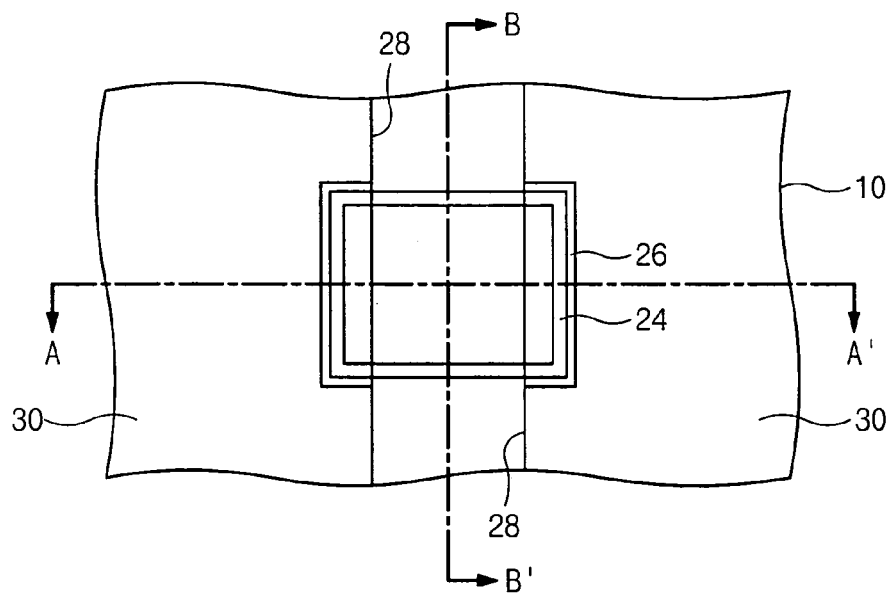
Figure 6B:
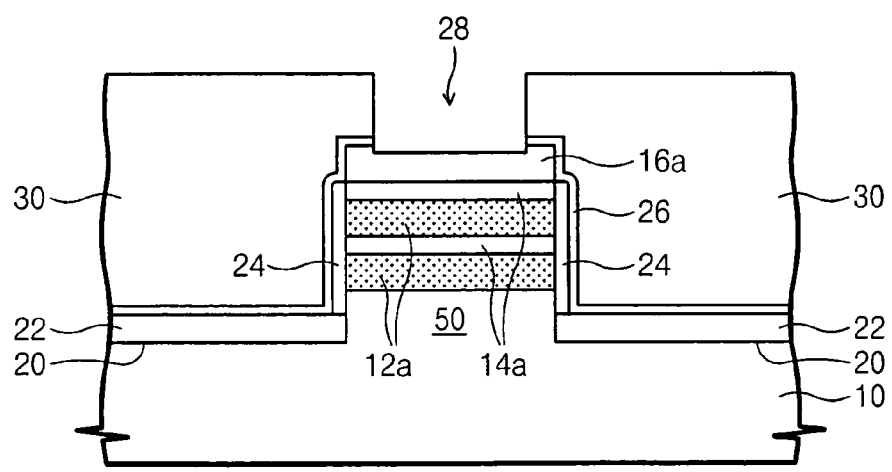
Figure 6C:
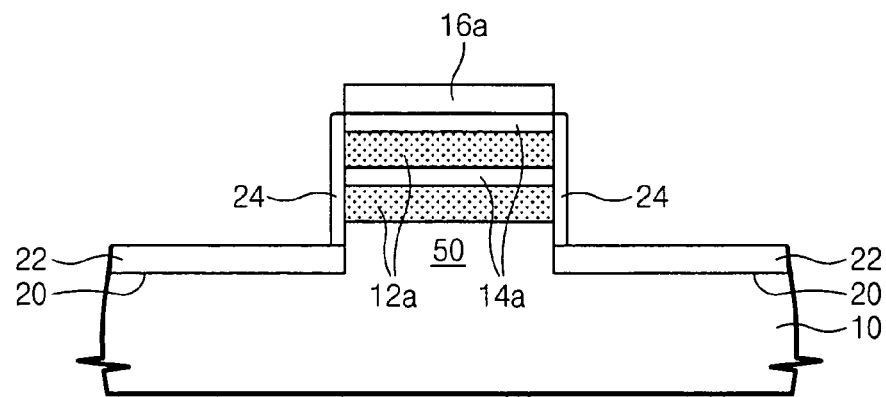

Referring now to FIGS. 6A through 6C, a second insulation pattern 30 may be formed on the surface of the integrated circuit substrate 10. The second insulation layer 30 may be patterned to form a gate opening 28 on the stacked pattern 18a. In some embodiments of the present invention, the etch stop layer 26 may be patterned after the second insulation pattern 30 is patterned. Accordingly, the gate opening 28 may expose a portion of the mask pattern 16a, the third epitaxial layer 24 and the first insulation pattern 22.

Figure 7A:
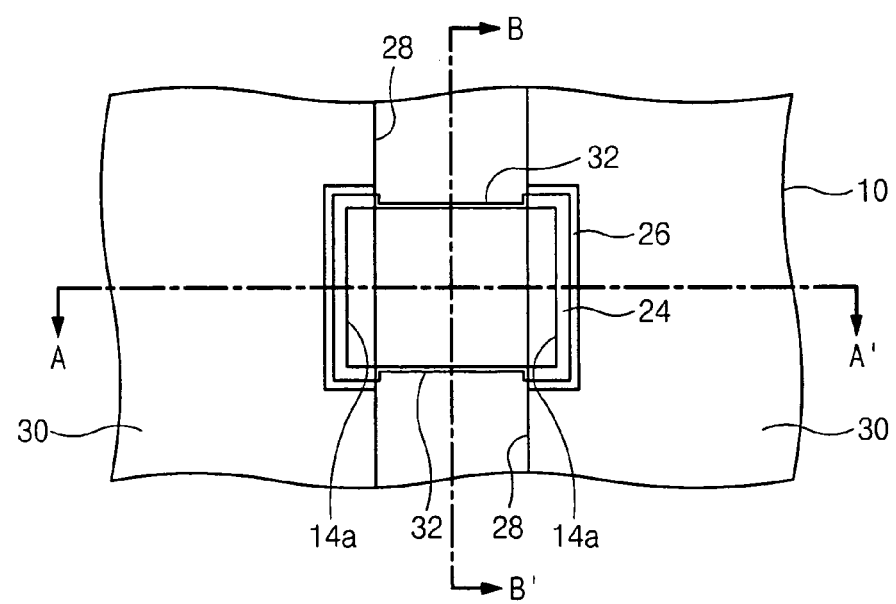
Figure 7B:
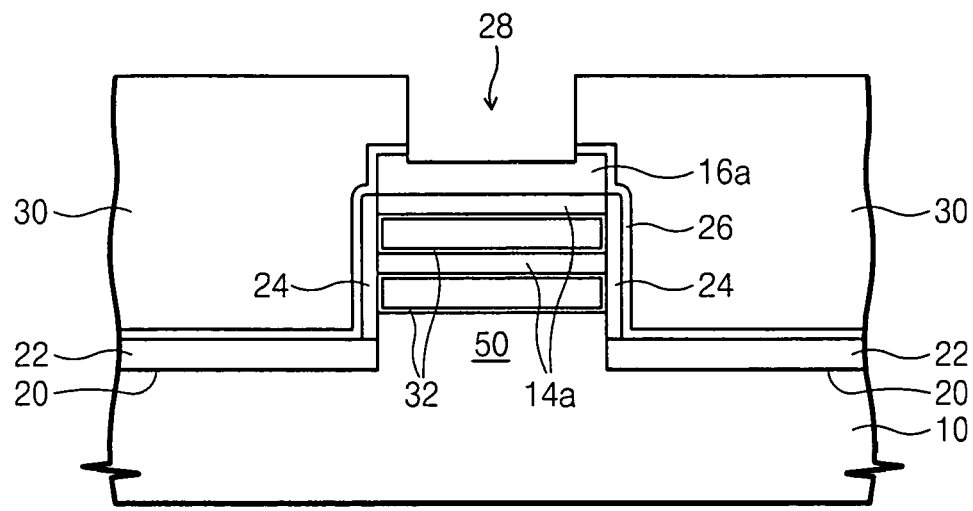
Figure 7C:
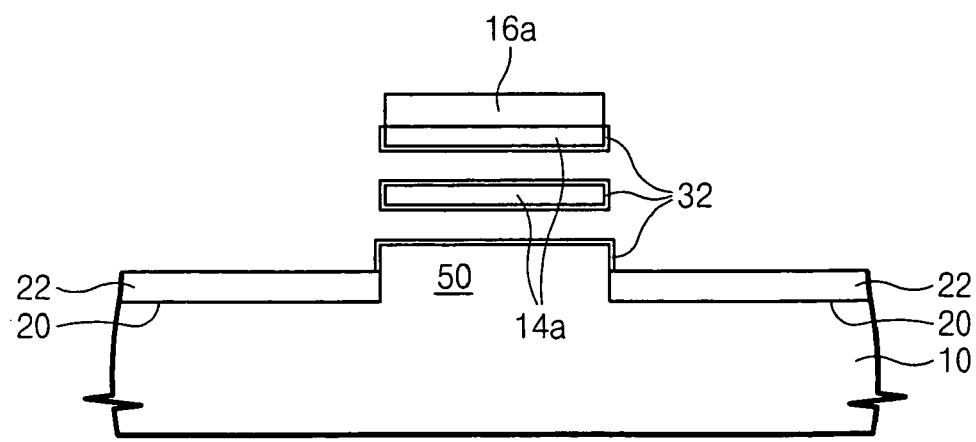

Referring now to FIGS. 7A through 7C, the third epitaxial layer 24 may be removed in the gate opening 28 to expose a portion of the first epitaxial patterns 12a and the second epitaxial patterns 14a. The first epitaxial patterns 12a are etched using, for example, an isotropic etch process, thereby removing the first epitaxial patterns 12a from the stacked pattern 18a. Accordingly, the second epitaxial patterns 14a are provided on the active region 50 and spaced apart from the active region 50. Upper surfaces of the active region 50 and the second epitaxial patterns 14a may provide a channel of the transistor.

A gate insulation layer 32 is formed on surface of the channel of the transistor. In other words, the gate insulation layer 32 is formed on a surface of the active region 50 and surfaces of the second epitaxial patterns 14a. The gate insulation layer 32 can be formed conformally using, for example, a thermal process or a chemical vapor deposition (CVD) method.

Figure 8A:
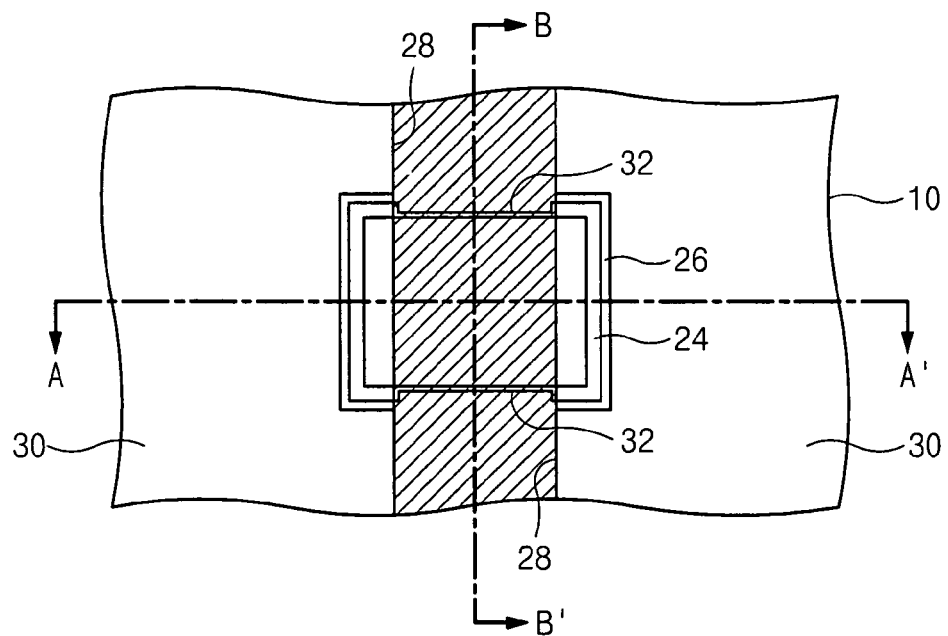
Figure 8B:
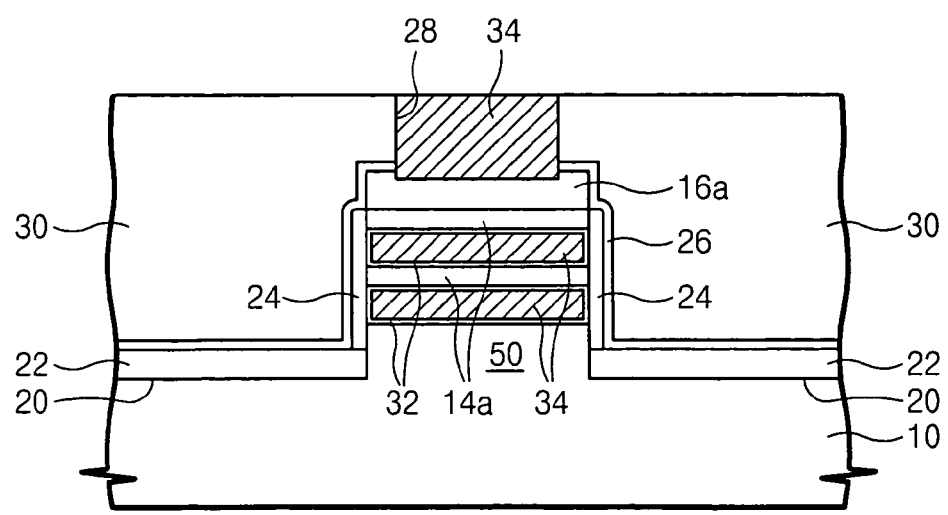
Figure 8C:
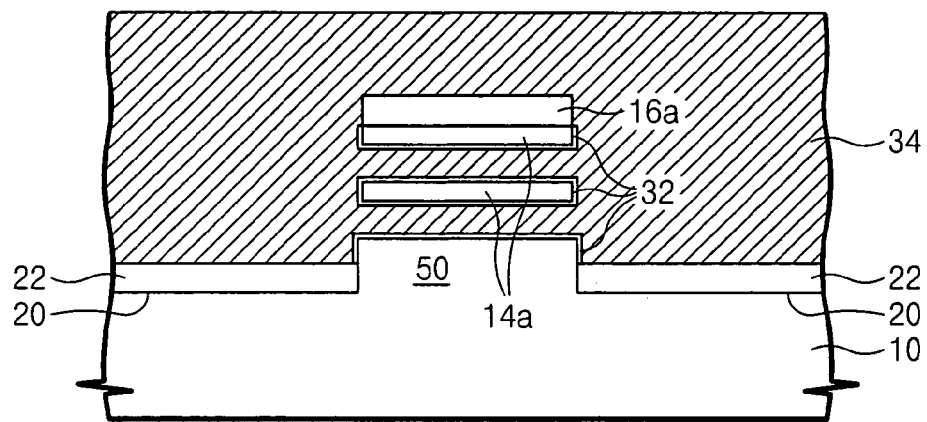

Referring now to FIGS. 8A through 8C, a gate pattern 34 is provided in the gate opening 28 by, for example, using a damascene process. In particular, a polysilicon layer may be formed on a surface of the second insulation pattern 30 and in the gate opening 28. The polysilicon layer may be planarized to form the gate pattern 34. In some embodiments of the present invention, the polysilicon layer may be formed in the gate opening 28 and a metal silicide layer may be formed on the resultant structure. The metal suicide layer may be planarized to form the gate pattern 34. The gate pattern 34 is formed on the mask pattern 16a and in the gap region between the channel regions 50 and 14a. In further embodiments of the present invention, after forming a polysilicon gate pattern 34, a silicide layer may be formed by, for example, performing a silicidation process on an exposed surface of the gate pattern 34. The channel of the transistor can be formed on surfaces of the second epitaxial patterns 14a and the active region 50 opposite to the gate pattern 34.

Figure 9A:
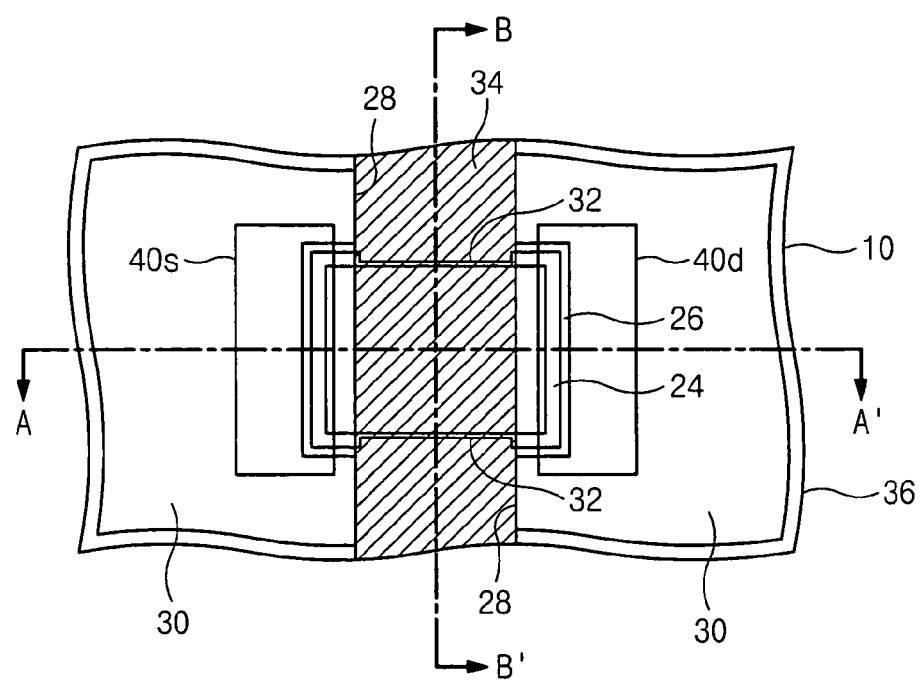
Figure 9B:
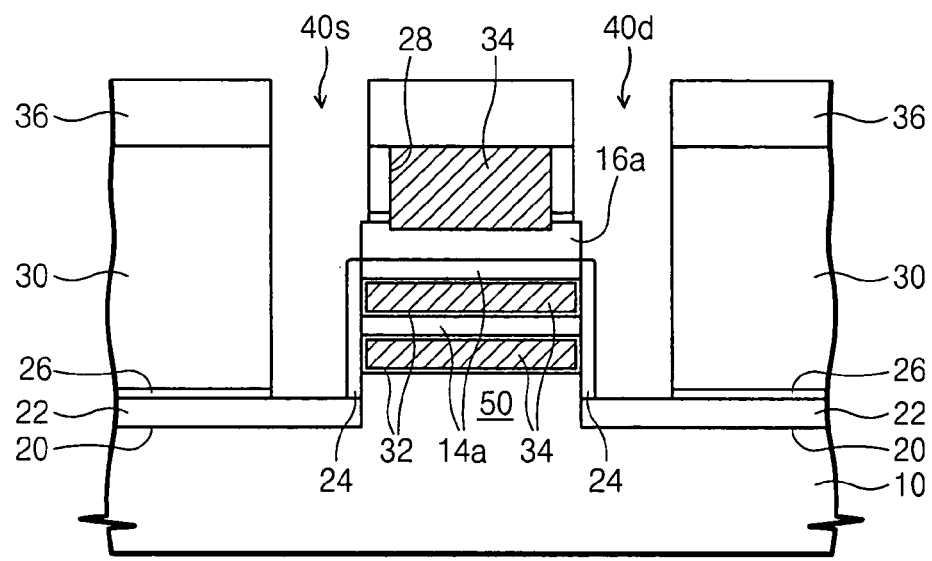
Figure 9C:
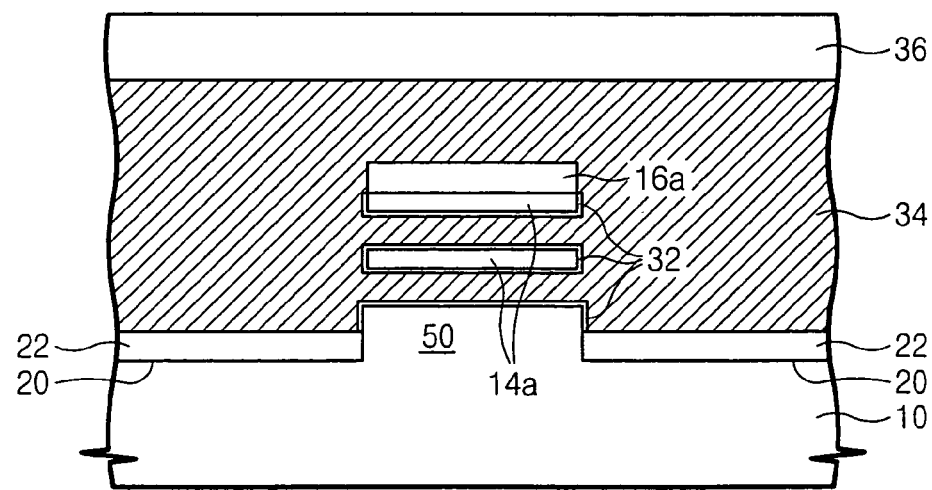

Referring now to FIGS. 9A through 9C, a third insulation pattern 36 is formed on a surface of the integrated circuit substrate including the gate pattern 34. The third insulation pattern 36 and the etch stop layer 26 may be patterned to expose the third epitaxial layer 24 to form a source contact hole 40s on a first side of the gate pattern 34 and a drain contact hole 40d on a second side of the gate pattern and spaced apart from the source contact hole 40s. In some embodiments of the present invention, the third epitaxial layer 24 may not be doped. Thus, in these embodiments of the present invention, impurities may be implanted through the source and drain contact holes 40s and 40d.

The presence of the first insulation pattern 22 on the floor of the source and drain contact holes 40s and 40d may reduce the likelihood that the integrated circuit substrate will be over etched during the formation of the source and drain contact holes 40s and 40d. A conductive layer is provided in the source and drain contact holes 40s and 40d to provide source and drain electrodes 42s and 42d (FIGS. 1B and 1C), respectively. The source and drain electrodes 42s and 42d are electrically coupled to the third epitaxial layer 24.

Figure 10A:
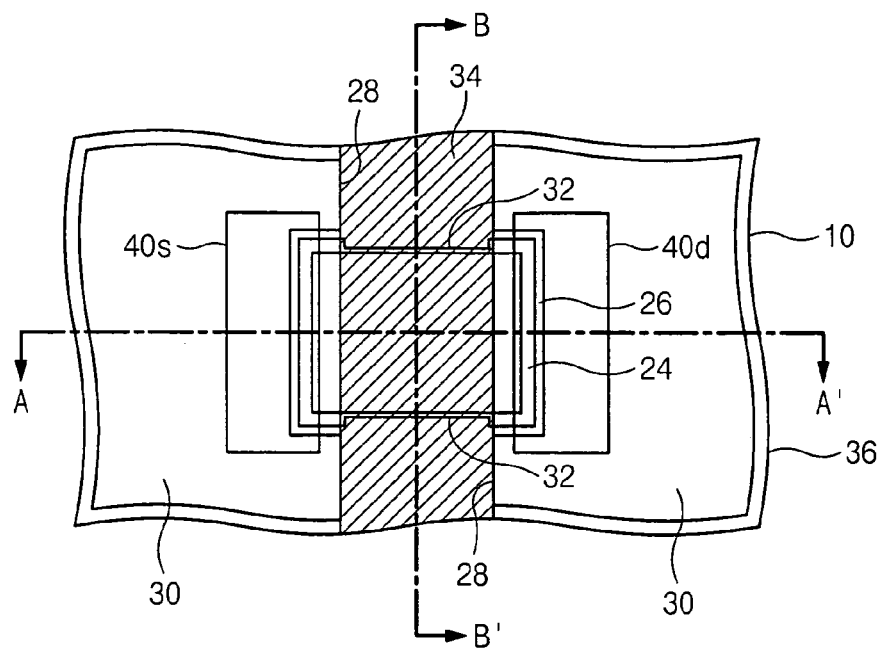
FIG. 10A is a cross-section of transistors according to further embodiments of the present invention.
Figure 10B:
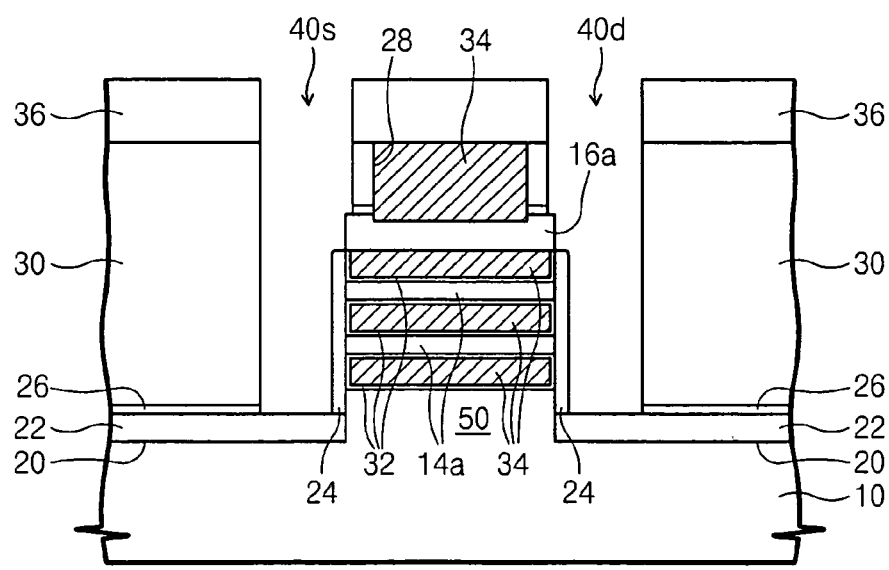
FIG. 10B is a cross-section taken along the line A-A' of FIG. 10A of transistors according to further embodiments of the present invention.
Figure 10C:
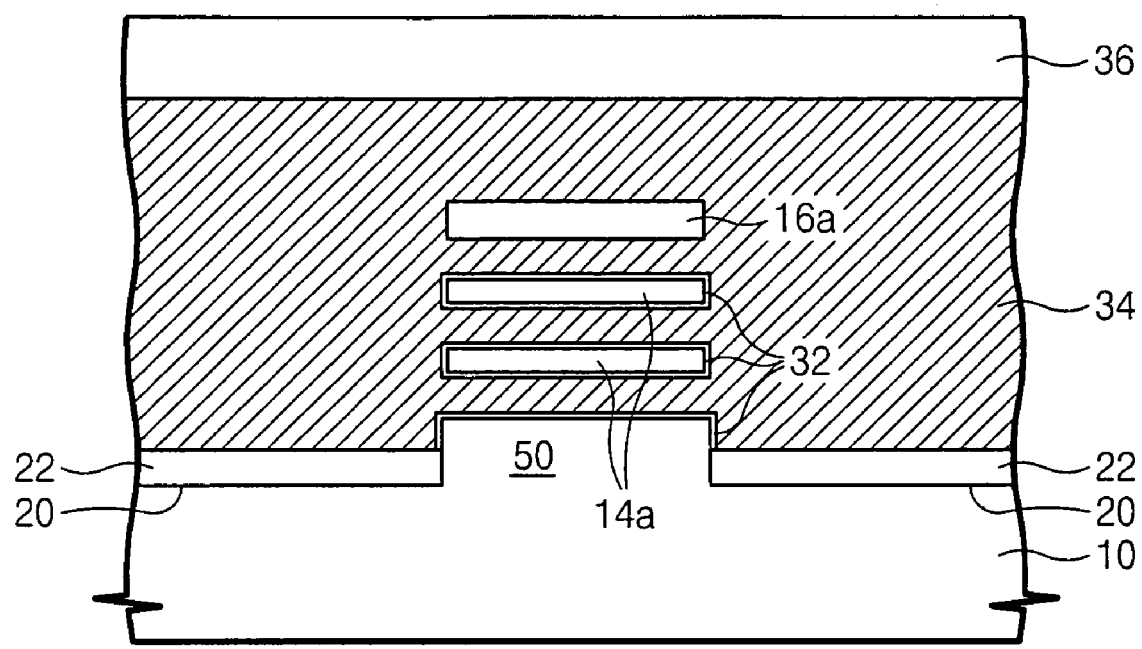
FIG. 10C is a cross-section taken along the line B-B' of FIG. 10A of transistors according to further embodiments of the present invention.

Referring now to FIGS. 10A through 10C, cross-sections of transistors according to further embodiments of the present invention will be discussed. FIG. 10B is a cross-section taken along the line A-A' of FIG. 10A. FIG. 10C is a cross-section taken along the line B-B' of FIG. 10A. Like reference numerals refer to like elements discussed above with respect to FIGS. 1A through 9C and, thus, details with respect to the like elements will not be repeated herein.

As illustrated in FIGS. 10A through 10C, a trench 20 (FIGS. 3B and 3C) is provided on the integrated circuit substrate 10. Similar to the first embodiment, the transistor includes a horizontal channel having at least two spaced apart horizontal channel regions 14a and 50 and vertical source and drain regions 52s and 52d (FIGS. 1A and 1B). Different from embodiments of the present invention discussed above with respect to FIGS. 2A through 9C, the upper most layer of the at least two horizontal channel regions 14a and 50 are vertically isolated by a mask pattern 16a. The gate pattern 34 is provided in a gap region between the horizontal channel regions 14a and between upper most layer of the horizontal channel region and the mask pattern 16a. The gate pattern 34 is provided on the horizontal channel regions 14a and 50. The gate insulation layer 32 is provided between the horizontal channel regions 14a and 50 and the gate pattern 34. However, different from embodiments of the present invention discussed above, a channel can be formed on an upper surface of the upper most layer of the horizontal channel region.

Transistors according to some embodiments of the present invention illustrated in FIGS. 10A through 10C may be formed using processing steps similar to those discussed above with respect to FIGS. 2A through 9C. However, in embodiments of the present invention illustrated in FIGS. 10A through 10C, the upper most layer of the stacked layer (18 of FIGS. 2A, 2B and 2C) is formed of a material having low etch selectivity relative to the integrated circuit substrate. As a result, the upper most layer of the stacked pattern is removed separating the mask pattern 16a from the horizontal channel region 14a.

As briefly discussed above with respect to FIGS. 1A through 10C, embodiments of the present invention provide a transistor having a channel including at least two channel horizontal channel regions. High driving currents may be used in transistors according to embodiments of the present invention based on the number of layers of horizontal channel regions. Accordingly, transistors according to embodiments of the present invention may provide high driving currents without increasing the dimensions of the transistor. Accordingly, more highly integrated devices may possibly be fabricated.

Furthermore, as discussed above, transistors according to embodiments of the present invention include vertical source and drain regions. Accordingly, the surface dimension of the source and drain regions is wide relative to conventional transistors even though the junction depth of the source and drain regions has been reduces. Therefore, the resistance of transistors according to embodiments of the present invention can be reduced. Finally, the presence of an etch stop layer may reduce damage caused to the integrated circuit substrate during the process of forming the source and drain contact holes, thus, a leakage current may be reduced.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a unit cell of a metal oxide semiconductor (MOS) transistor, comprising:

forming a MOS transistor on an integrated circuit substrate including an isolation layer and an active region higher than the isolation layer, the MOS transistor having a pair of junctions consisting of a vertical source region and a vertical drain region on the isolation layer, and a plurality of gates on the active region, the plurality of gates being formed simultaneously to be stacked between the vertical source region and the vertical drain region;

forming a horizontal channel between the vertical source region and the vertical drain region by growing single crystalline layers vertically spaced apart from each other on the active region, the horizontal channel including at least two horizontal channel regions formed in spaced apart patterns, wherein widths of the plurality of gates that contact the at least two horizontal channel regions are substantially identical, and wherein the pair of junctions are vertically formed to cover the sides of the active region in other patterns adjacent to sides of the spaced apart patterns so that the pair of vertical junctions contact the sides of the at least two spaced apart horizontal channel regions; and forming a vertical source electrode electrically connected to the vertical source region and a vertical drain electrode electrically connected to the vertical drain region, wherein the vertical source and drain electrodes are formed on the isolation layer so that the vertical source and drain electrodes contact sides of the vertical source and drain regions, respectively.

2. The method of claim 1, wherein forming the at least two spaced apart horizontal channel region comprises:
   forming the active region on the integrated circuit substrate; and
   forming at least one epitaxial pattern on the active region and spaced apart from the active region.

3. The method of claim 2, wherein forming the at least one epitaxial pattern comprises forming first and second epitaxial patterns, the second epitaxial pattern being on the first epitaxial pattern and spaced apart from the first epitaxial pattern, the method further comprising:
   forming a mask pattern on the second epitaxial pattern.

4. The method of claim 3, wherein the mask pattern is directly on the second epitaxial pattern, the mask pattern preventing the plurality of gates from connecting to the vertical source and drain electrodes.

5. The method of claim 1, wherein forming the pair of junctions comprises forming the vertical source region and the vertical drain region, the vertical source region being on a first side of the horizontal channel region and the vertical drain region being on a second side of the horizontal channel region and spaced apart from the vertical source region.

6. The method of claim 5, further comprising:
   forming a gate pattern on the horizontal channel and between the at least two spaced apart horizontal channel regions; and
   forming a gate insulation layer between the gate pattern and the at least two spaced apart horizontal channel regions.

7. The method of claim 6, further comprising:
   forming a first insulation pattern among the vertical source electrode, the vertical drain electrode and the integrated circuit substrate and between the gate pattern and the integrated circuit substrate.

8. The method of claim 7, further comprising:
   forming a mask pattern on the horizontal channel, wherein the gate pattern extends between an upper channel region of the at least three spaced apart horizontal channel regions and the mask pattern.

9. The method of claim 8, further comprising:
   forming a second insulation pattern on the horizontal channel, the vertical source region and the vertical drain region, wherein the second insulation pattern defines a gate opening on the horizontal channel, wherein the gate pattern is provided in the gate opening and wherein the vertical source electrode and the vertical drain electrode extend through the second insulation pattern and are respectively connected to the vertical source region and the vertical drain region.

10. The method of claim 9, further comprising:
    forming a third insulation pattern on the second insulation pattern and the gate pattern, wherein the vertical source electrode and the vertical drain electrode extended through the third insulation pattern and the second insulation pattern and are respectively connected to the vertical source region and the vertical drain region.

11. The method of claim 10, wherein an upper surface of the first insulation pattern is higher relative to a lower surface of the gate pattern.

12. A method of fabricating a transistor comprising:
    alternately stacking sets of first and second epitaxial layers on an integrated circuit substrate; and
    patterning the sets of the first and second epitaxial layers and the integrated circuit substrate to form a trench region on the integrated circuit substrate to define an active region, and a stacked structure including the sets of the first and second epitaxial patterns;
    forming a first insulation pattern on a floor of the trench;
    growing a third epitaxial layer on sidewalls of the sets of first and second epitaxial patterns and sidewalls of the active region higher than the first insulation pattern;
    forming a second insulation pattern on a surface of the integrated circuit substrate, the second insulation pattern defining a gate opening that exposes at least a portion of the third epitaxial layer;
    removing the third epitaxial layer in the gate opening to expose the sets of first and second epitaxial patterns;
    selectively etching the first epitaxial patterns of the sets of first and second epitaxial patterns to form a horizontal channel region having a plurality of spaced apart single crystalline channel layers;
    forming a gate oxide layer on a surface of channel layers;
    forming a gate pattern on the horizontal channel and in gap regions between the channel layers and the gate opening, wherein the gate pattern comprises a plurality of gates formed simultaneously between the plurality of spaced apart single crystalline channel layers and widths of the plurality of gates that contact the plurality of single crystalline channel layers are substantially identical; and
    forming a vertical source electrode and a vertical drain electrode on the first insulation pattern penetrating the second insulation pattern to be connected to the third epitaxial layer.

13. The method of claim 12, wherein the first and third epitaxial layers comprise silicon and wherein the second epitaxial layer comprises silicon germanium.

14. The method of claim 12, wherein an upper surface of the first insulation pattern is formed lower relative to the first epitaxial layer.

15. The method of claim 12, wherein forming the second insulation pattern is preceded by:
    forming an etch stop layer conformally on a resultant structure including the third epitaxial layer, wherein forming the gate opening comprises sequentially patterning the second insulation pattern and the etch stop layer and wherein the vertical source electrode and the vertical drain electrode penetrate the etch stop layer to be connected to the third epitaxial layer.

16. The method of claim 12, wherein forming the second insulation pattern is preceded by:
    implanting impurities in the first and second epitaxial layers to form channel doped layers; and
    implanting impurities into the third epitaxial layer to form a vertical source region and a vertical drain region.

17. The method of claim 12, wherein forming the stacking structure of the first and second epitaxial patterns further comprises forming a mask pattern at the upper most layer, and wherein the first and second epitaxial patterns are alternately stacked.

18. A method of forming a unit cell of a metal oxide semiconductor (MOS) transistor, comprising:
    providing an integrated circuit substrate including a trench and an active region higher than the trench, wherein the active region protrudes from the integrated circuit substrate to function as a horizontal channel;
    forming the horizontal channel between a vertical source region and a vertical drain region, the horizontal channel including at least two single crystalline horizontal channel regions formed in spaced apart patterns, and further including the active region higher than the trench;
    forming a plurality of gates simultaneously between at least two single crystalline horizontal channel regions, wherein widths of the plurality of gates that contact the at least two single crystalline horizontal channel regions are substantially identical;

forming the vertical source region and the vertical drain region in other patterns at one side of the spaced apart patterns, respectively, wherein the vertical source and drain regions extend along sides of the at least two horizontal channel regions and sides of the active region protruding from the integrated circuit substrate; and forming a vertical source electrode contacted to a side of the vertical source region and a vertical drain electrode contacted to a side of the vertical drain region.

* * * * *